US010601380B2

(12) United States Patent
Chen et al.

(10) Patent No.: US 10,601,380 B2
(45) Date of Patent: *Mar. 24, 2020

(54) BAND-RECONFIGURABLE AND LOAD-ADAPTIVE POWER AMPLIFIER

(71) Applicant: PURDUE RESEARCH FOUNDATION, West Lafayette, IN (US)

(72) Inventors: Kenle Chen, Irvine, CA (US); Dimitrios Peroulis, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/182,149

(22) Filed: Nov. 6, 2018

(65) Prior Publication Data

US 2019/0199297 A1 Jun. 27, 2019

Related U.S. Application Data

(63) Continuation of application No. 14/786,890, filed as application No. PCT/US2014/035251 on Apr. 24, 2014, now Pat. No. 10,122,327.

(Continued)

(51) Int. Cl.
*H03F 3/04* (2006.01)
*H03F 1/56* (2006.01)
(Continued)

(52) U.S. Cl.
CPC .......... *H03F 1/565* (2013.01); *H03F 1/0205* (2013.01); *H03F 3/19* (2013.01); *H03F 3/193* (2013.01);
(Continued)

(58) Field of Classification Search
CPC ........ H03F 1/565; H03F 3/193; H03F 1/0205; H03F 3/19; H03F 3/21; H03F 2200/451; H03F 2200/378; H03F 2200/546
(Continued)

(56) References Cited

U.S. PATENT DOCUMENTS 6,236,274 B1  5/2001 Liu
6,859,104 B2  2/2005 Toncich
(Continued)

FOREIGN PATENT DOCUMENTS

JP  2009010910 A  1/2009

OTHER PUBLICATIONS

A. Adahl and H. Zirath, "A 1GHz Class E LDMOS Power Amplifier", in 33rd Eur. Microw. Conf., Oct. 2003, vol. 1, pp. 285-288.
(Continued)

*Primary Examiner* — Khanh V Nguyen
*Assistant Examiner* — Khiem D Nguyen
(74) *Attorney, Agent, or Firm* — Maginot, Moore & Beck LLP

(57) ABSTRACT

A tunable amplifier includes continuous tunability for both frequency and power levels. The tunable amplifier includes a combination of a tunable series resonator and a multi-stage LC network as the output matching network. The tunable amplifier incorporates a variable diode varactor with high breakdown voltage and high tuning range into a tunable resonator. The tunable resonator is connected to a fixed output matching network to enable a wide range of operating frequencies. The tunable amplifier enables high power, high efficiency, broadband and load-modulated power amplification, which is greatly desired for next-generation wireless communication systems and other high-frequency applications.

18 Claims, 11 Drawing Sheets

Related U.S. Application Data

(60) Provisional application No. 61/815,542, filed on Apr. 24, 2013.

(51) Int. Cl.
*H03F 3/193* (2006.01)
*H03F 1/02* (2006.01)
*H03F 3/19* (2006.01)
*H03F 3/21* (2006.01)

(52) U.S. Cl.
CPC .......... *H03F 3/21* (2013.01); *H03F 2200/378* (2013.01); *H03F 2200/451* (2013.01); *H03F 2200/546* (2013.01)

(58) Field of Classification Search
USPC .................................. 330/296, 302–306, 285
See application file for complete search history.

(56) References Cited

U.S. PATENT DOCUMENTS

| | | | |
|---|---|---|---|
| 6,977,562 B2 | 12/2005 | Park | |
| 6,992,543 B2 | 1/2006 | Luetzelschwab | |
| 7,671,693 B2 | 3/2010 | Brobston | |
| 7,764,125 B2 | 7/2010 | Dawe | |
| 7,911,277 B2 | 3/2011 | Paul | |
| 8,174,311 B2 * | 5/2012 | Jos | H03F 3/2176 330/10 |
| 8,253,496 B2 | 8/2012 | Ichitsubo | |
| 2004/0012444 A1 | 1/2004 | Bharj | |
| 2007/0207748 A1 | 9/2007 | Toncich | |
| 2008/0094149 A1 | 4/2008 | Brobston | |
| 2008/0204142 A1 | 8/2008 | Kang | |
| 2009/0174496 A1 | 7/2009 | Van Bezooijen | |
| 2010/0308933 A1 | 12/2010 | See | |
| 2012/0007690 A1 | 1/2012 | Van Bezooijen | |
| 2013/0063223 A1 * | 3/2013 | See | H03H 7/38 333/32 |

OTHER PUBLICATIONS

J. Kang, D. Yu, K. Min and B. Kim, "A ultra-high PAE Doherty amplifier based on 0.13-mm CMOS process", IEEE Microw. Wireless Compon. Lett., vol. 16, No. 9, pp. 505-507, Sep. 2006.

G. Hanington, P. -F. Chen, P. M. Asbeck, and L. E. Larson, "High efficiency power amplifier using dynamic power-supply voltage for CDMA applications", IEEE Trans. Microw. Theory Tech., vol. 47, No. 8, pp. 1471-1476, Aug. 1999.

W. E. Neo, J. Lin, X. Liu, L. C. N. de Vreede, L. E. Larson, M. Spirito, M. Pelk, K. Buisman, A. Akhnoukh, A. de Graauw, and L. Nanver, "Adaptive multi-band multi-mode power amplifier using integrated varactor-based tunable matching network", IEEE J. Solid-State Circuits, vol. 41, No. 9, pp. 2166-2177, Sep. 2006.

K. Entesari, A. R. Tavakoli, and A. Helmy, "CMOS Distributed Amplifiers With Extended Flat Bandwidth and Improved Input Matching Using Gate Line With Coupled Inductors ", IEEE Trans. Microw. Theory Tech., vol. 57, No. 12, pp. 2868-2871, Dec. 2009.

P. Wright, J. Lees, J. Benedikt, P. J. Tasker, S. C. Cripps, "A methodology for realizing high efficiency Class-J in a linear and broadband PA", IEEE Trans. Microw. Theory Tech., vol. 57, No. 12, pp. 3196-3204, Dec. 2006.

K. Buisman, L. C. N. de Vreede, L. E. Larson, M. Spirito, A. Akhnoukh, T. L. M. Scholtes, and L. Nanver, "Distortion free varactor diode topologies for RF adaptivity", in Proc. IEEE MTTS Int. Microwave Symp., 2005, pp. 157-160.

Raab, F. H., "High-efficiency linear amplification by dynamic load modulation", Proc. IEEE MTTS Int. Microwave Symposium, 2003, pp. 1717-1720.

Fu, J. et al., "Improving power amplifier efficiency and linearity using a dynamically controlled tunable matching network", IEEE Trans. Microw. Theory Tech., Dec. 2008, pp. 3239-3244, vol. 56, No. 12.

Nemati, H. M., et al., "Design of varactor-based tunable matching networks for dynamic load modulation of high power amplifier," IEEE Trans. Microw. Theory Tech., May 2009, pp. 1110-1118, vol. 57, No. 5.

Raab, F. H., "Electronically tunable Class-E power amplifier," Proc. IEEE MTTS Int. Microwave Symposium, 2001, pp. 1513-1516.

Cripps, S. C., "RF Power Amplifier for Wireless Communications," 2nd edition, Artech, 2006, Boston, MA.

International Search Report and Written Opinion in related case PCT/US2014/035251 dated Sep. 22, 2014.

* cited by examiner

BAND-RECONFIGURABLE AND LOAD-ADAPTIVE POWER AMPLIFIER

CLAIM OF PRIORITY

This application is a continuation U.S. patent application Ser. No. 14/786,890, which in turn claims priority to U.S. Provisional Application No. 61/815,542, which is entitled "A Tunable GaAs Power Amplifier For Broadband and Large Power Range Applications," and was filed on Apr. 24, 2013, the entire contents of which are hereby incorporated by reference herein.

TECHNICAL FIELD

This document relates generally to electronic circuits and, more particularly, to amplifier electronic circuits that are tunable over a range of frequencies.

BACKGROUND

Power amplification (PA) is a significant portion of power consumption in wireless transceivers. Next generation mobile wireless communication systems require both high power and high efficiency power amplifiers to provide good communication quality and long battery life. Some designs for high efficiency and high power PAs are known to the art, and many of the amplifiers are implemented based on Class-E and Class-F amplifier topologies. Modern bandwidth-efficient communication signals usually have high peak-to-average ratios (PARs), which makes the PA operate with significant power back-offs. For example, most of the 4G systems are based on orthogonal frequency-division multiplexing (OFDM) signals, which include multiple independent carriers where each carrier transports parallel data. For 54 Mbps 64-QAM signal of IEEE 802.11g WLAN is composed by 48 carrier signals and four pilot signals with PAR of over 10 dB. Existing amplifier designs that are configured for these applications require extra circuits, such as envelope amplifier for dynamic biasing and an additional peak PA for the Doherty topology, which introduce additional losses, size issues, and increase the complexity of the entire circuit. Comparatively, dynamic load modulation (DLM) is a known method for improving the efficiency at power back-offs. DLM utilizes tunable output matching networks (OMNs) with passive tuning components which do not consume DC power and can be designed as a part of the OMN.

Five characteristics are desired for power amplifiers in high-frequency applications: high power (typically >1 W), high peak efficiency (>60%), broad bandwidth (up to one octave), high linearity, and efficiency enhancement at power back-offs (>30% at 6 dB back-off). Neither the existing fixed-frequency nor tunable power amplifier designs that are known to the art meet all four of the desired characteristics simultaneously. Consequently, improvements to amplifiers that enable high power output, high efficiency, wide band tunability with strong linearity, and high efficiency in power back-off situations would be beneficial.

SUMMARY

An embodiment of a tunable power amplifier includes continuous tunability for both frequency and power levels. The amplifier's output matching circuit comprises a tunable portion and a static portion. The tunable portion is formed by a variable capacitor and a fixed inductor connected in series. This tunable portion is placed between the transistor output and the static portion which is a fixed broadband matching network. This output matching circuit enables a wide range of operating frequencies, which are in a range of 0.7 GHz to 2.7 GHz in one embodiment, while being capable of performing dynamic load line modulation within more than 10 dB power range. In one embodiment, the amplifier operates with a power output of 2 W and efficiency of 60%-70% at peak power and >30% at 10-dB back-off. Besides high efficiency, high linearity can also be achieved with this tunable power amplifier topology meeting the 4G wireless communication standard in one embodiment in which adjacent channel leakage ratio (ACLR) is <−35 dB. The amplifier enables high power, high efficiency, high linearity, broadband and load-modulated power amplification, which is greatly desired for next-generation wireless communication systems and other high-frequency applications.

In one embodiment an electronic circuit includes an input matching network, a fixed output matching network, a transistor, and a tunable resonator. The transistor includes a gate connected to the input matching network, a source connected to ground, and a drain directly connected to an input of the tunable resonator. The tunable resonator includes a varactor having an input directly connected in series to the drain of the transistor and the input of the varactor being configured to be connected to a drain voltage source, and an inductor having an input connected in series to an output of the varactor and an output connected to the fixed output matching network.

In another embodiment, a method for signal amplification has been developed. The method includes generating with an input matching network an impedance matched signal corresponding to an input signal, the impedance matched signal being provided to a gate of a transistor to control operation of the transistor, generating with the transistor an output through a drain of the transistor that is directly connected to an input of a varactor in response to the impedance matched signal from the input matching network, and generating with the varactor and an inductor connected to an output of the varactor an amplified output signal corresponding to the input signal.

In another embodiment, a tunable matching circuit has been developed. The circuit includes a varactor having an input configured to be connected directly to an input signal source, an inductor having an input connected in series to an output of the varactor, and a fixed output matching network comprising at least one inductor-capacitor (LC) circuit with an input that is connected in series to an output of the inductor and an output that is configured to be connected to an output load.

DETAILED DESCRIPTION

For the purposes of promoting an understanding of the principles of the embodiments described herein, reference is now be made to the drawings and descriptions in the following written specification. No limitation to the scope of the subject matter is intended by the references. This patent also includes any alterations and modifications to the illustrated embodiments and includes further applications of the principles of the described embodiments as would normally occur to one skilled in the art to which this document pertains.

While some embodiments of tunable amplifiers are known to the art, the embodiments described below include novel features that are not present in existing tunable amplifiers. In a non-limiting example of novel structure that is described in more detail below, an amplifier that is tunable over a wide range of frequencies with strong linearity (e.g. ACLR is <−35 dB) and high efficiency only requires a single variable capacitor component, such as a varactor, to provide tuning for the amplifier in combination with a fixed output matching network that does not require dynamic components such as variable capacitors and variable inductors. Additionally, the embodiments described include a transistor in an amplifier has a drain that is directly connected to an input of the variable capacitor that is connected in series with an inductor to form a tunable resonator. In some embodiments, the variable capacitor is a varactor having a range of capacitance values that are adjusted using a biasing voltage. This differs from the typical prior art arrangement of tunable amplifiers where the switch is connected to an inductor and resonators.

Figure 1:
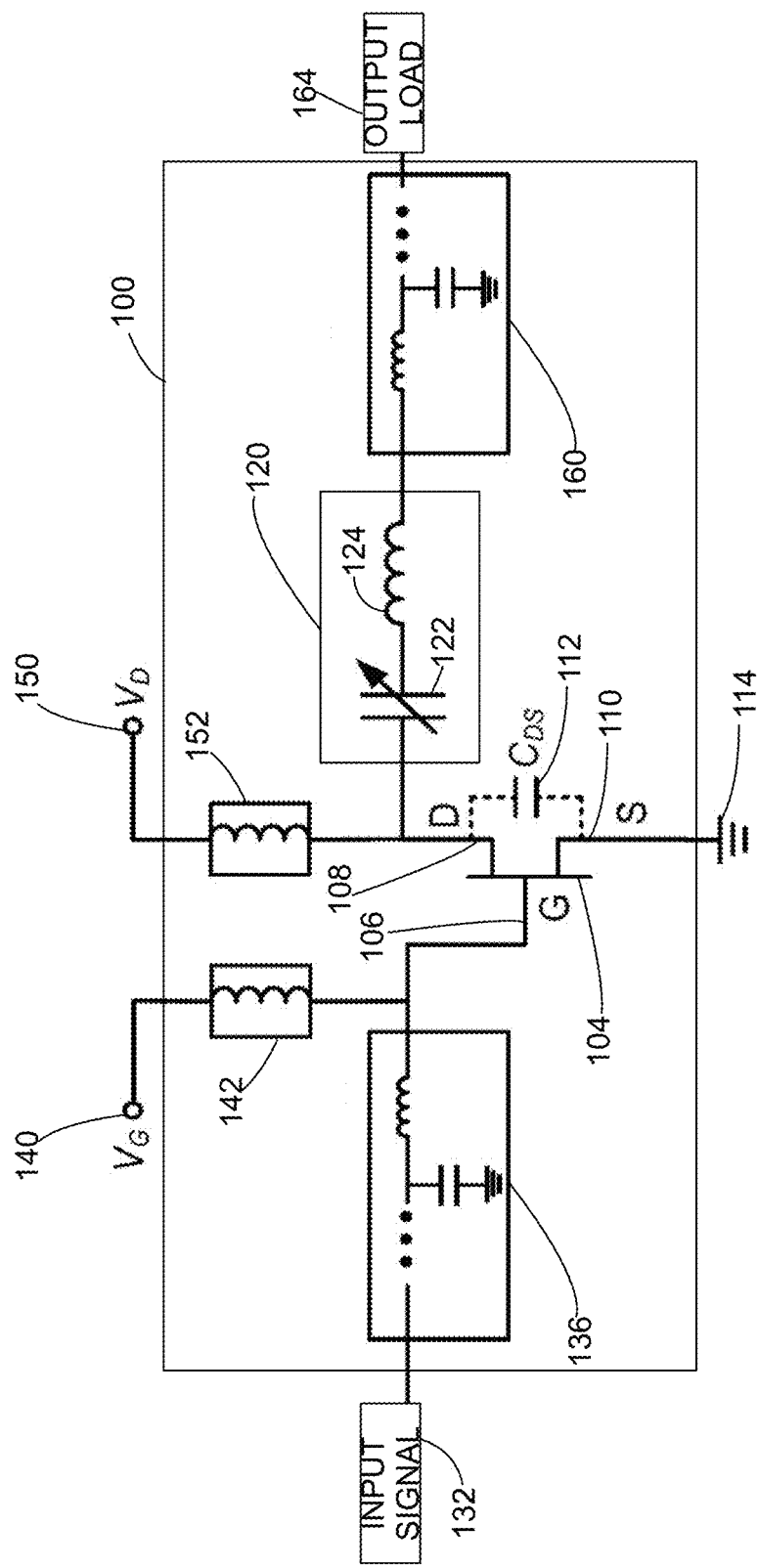
FIG. 1 is a schematic diagram of an amplifier electronic circuit.

FIG. 1 depicts a schematic diagram of an amplifier electronic circuit 100 that includes a tunable component to enable amplification of frequencies over a wide frequency band with a high degree of linearity over the frequency band and a predetermined power output band. The amplifier 100 includes a transistor 104, a drain-source capacitor 112, a tunable resonator 120, an input matching network 136, a gate inductor 142, drain inductor 152, and a fixed output matching network 160. The transistor 104 includes a gate 106, drain 108, and source 110. The tunable resonator 120 further includes a varactor 122 and an inductor 124. An input of the varactor 122 is connected to the transistor 104 directly in series with the drain 112 without any additional inductors or other components placed in a series connection between the drain 112 and the input of the varactor 122. The output of the varactor 122 is connected in series with an input of the inductor 124, and an output of the inductor 124 is connected in series with an input of the fixed output matching network 160. While FIG. 1 depicts a configuration of the tunable resonator 120 where the input of the variable capacitor (varactor) 122 is directly connected to the drain 108 in the transistor 104 and the output of the varactor 122 is connected in series to an input of the inductor 124, in another configuration the order is reversed with the input of the inductor 124 connected directly to the drain 108 and to the drain voltage source 150 through the inductor 152, the output of the inductor 124 connected in series to the input of the varactor 122, and the output of the varactor 122 connected in series to an input of the fixed output matching network 160. In FIG. 1, the capacitor 112 is connected in parallel with the drain 108 and source 110. In some embodiments, the capacitor 112 represents internal capacitance within the transistor 104, while in other embodiments the capacitor 112 is a discrete component in the amplifier 100.

The input matching network 136 includes a combination of capacitors and inductors to match an input impedance of the amplifier 100 to the impedance of the signal source 132. Impedance matching is well-known to the art to prevent signal echoes and to enable efficient operation of the amplifier 100. The input matching network 136 also acts as a low-pass filter that attenuates high-frequency harmonics of the input signal 132 and other high-frequency noise sources before the input signal reaches the transistor gate 106. The input signal from the input signal source 132 is a time-varying signal that has, for example, a square wave, sinusoidal wave, or other time varying waveform within a predetermined frequency range. In the embodiment of FIG. 1, the gate voltage source 140 ($V_G$) generates a voltage that is slightly higher than a gate threshold voltage in the transistor 104. The gate voltage $V_G$ is supplied to the gate 106 through an inductor 142.

In the amplifier 100, the drain 108 in the transistor 104 is connected to a drain voltage source 150 through an inductor 152 and the source 110 in the transistor 104 is connected to ground 114. The drain 108 in the transistor is connected to an external drain voltage source 150, which is also referred to as a supply voltage source, through an inductor 152. The drain voltage source 150 provides electrical power to drive the output of the amplifier 100. The drain 108 is also directly connected in series with the varactor 122 in the tunable resonator 120.

The tunable resonator 120 includes the varactor 122 that is connected in series with the fixed inductor 124. The varactor has an adjustable capacitance over a predetermined range between a minimum capacitance level and a maximum capacitance level. Since the inductor 124 is a fixed inductor, changes to the capacitance of the varactor 122 result in a change of the resonant frequency for the tunable resonator 120. The following equation describes the ideal characteristics of the tunable resonator 120:

$$C_{Res} = \frac{1}{\omega L_{Res}} \rightarrow \frac{C_{Res,max}}{C_{Res,min}} = \frac{\omega_{max}^2}{\omega_{min}^2}$$

where ω is the angular resonant frequency of the tunable resonator, $\omega_{max}$ is the maximum tunable frequency, $\omega_{min}$ is the minimum tunable frequency, $L_{Res}$ is the fixed inductance of the inductor 124, $C_{Res}$ is the capacitance of the varactor 122 that is selected for a tuned frequency, and $C_{Res,max}$ and $C_{Res,min}$ are the maximum and minimum capacitance levels, respectively, for the varactor 122. As depicted in the preceding equation, the ratio of $C_{Res,max}$ and $C_{Res,min}$ defines the upper and lower frequency bounds for the tunable resonator 120. For example, a tunable resonator on a band of 1 GHz to 2 GHz has a ratio of $C_{Res,max}$ to $C_{Res,min}$ ratio of 4:1.

The ratios provided in the ideal equation are not necessarily achievable in a practical embodiment of the amplifier 100. As is known in the art, varactors make use of reverse-biased diodes. When used in an amplifier, the voltage swing on the diode is usually large as a high power is delivered through the fixed output matching network 160 to the load 164. The power handling capability of diodes in the varactor can handle the output power levels, but high voltage swing also effectively reduces the bias voltage of the diodes in the varactor that control the capacitance level of the varactor. The following inequality illustrates this point: $V_{RF} < V_{Bias} < V_{Break} - V_{RF}$, where $V_{RF}$ is the total voltage across the varactor 122, $V_{Bias}$ is the bias voltage that is applied to the varactor to control the capacitance, where higher $V_{Bias}$ voltages generate lower capacitance levels, and $V_{Break}$ is the breakdown voltage of the diodes in the varactor.

Given the restrictions with the varactor, the maximum real-valued component of the output current $I_{RF}$ from the amplifier is set forth in the following equation:

$$I_{RF} = \sqrt{\frac{2P_{out}}{R_L}}$$

where $R_L$ is the inherent resistance of the inductor 124 in the tuned resonator 120 (e.g. 5Ω), and $P_{out}$ is the maximum output power level for the amplifier, (e.g. 2 watts). Using an example amplifier configuration where $R_L$=5Ω and $P_{out}$=2 W, $I_{RF}$ is 0.8 A. The corresponding voltage swing across the varactor 122 is:

$$V_{RF} = I_{RF} \times \frac{1}{\omega C_{Res}},$$

which indicates that a smaller capacitance values and larger resonant frequencies generate larger voltage swings $V_{RF}$. Since $V_{RF}$ must stay below the maximum value of $V_{Bias}$, the practical range of frequencies for use with the varactor 122 may be limited in some embodiments. As described below, in some embodiments the varactor 122 further comprises a parallel array of multiple varactors, which are referred to as varactor elements, to form a varactor that enables changing the resonant frequency of the tuned resonator 120 over a wide range of frequencies in a predetermined frequency band.

In combination, the tunable resonator 120 and the fixed matching network 160 are referred to as a "tunable matching network" in which the tunable resonator 120 matches the reactive portion of the impedance between the amplifier 100 and the load 164 while the fixed matching network 160 matches the real-valued portion of the impedance between the amplifier 100 and the load 164. The fixed output matching network 160 is another matching network that includes inductors and capacitors in a similar arrangement to the input matching network 136. The tunable matching network including the tunable resonator 120 and the fixed output matching network 160 performs impedance matching for an output load 164 that receives the amplified signal from the amplifier 100. The fixed output matching network 160 also acts as a low-pass filter to attenuate high-frequency noise and harmonics from the output single in a similar manner to the operation of the input matching network 136 to attenuate high-frequency components from the input signal. For example, in one embodiment that is described in more detail below, the output load 164 has a 50Ω impedance while the output of the tuned resonator 120 is approximately 5Ω at a predetermined maximum output power level of 2 watts.

During operation, the amplifier receives an input signal 132 and generates an amplified version of the signal for an output load 164. The input matching network 136 receives the input signal 132 and generates an impedance-matched input signal for the gate 106 of the transistor 104. The transistor 104 generates an output from the drain 108 using the drain voltage source 150 to produce the output signal from the drain. The varactor 122 in the tunable resonator 120 receives the amplified signal and the varactor 122 and inductor 124 in the tunable resonator 120 generate an amplified output signal at a predetermined tuned frequency corresponding to the input signal 132. The fixed matching network 160 receives the signal and performs impedance matching for a real-valued portion of the amplified output signal to generate the final output signal for the output load 164. The tunable resonator 120 is tuned to a frequency corresponding to a frequency component in the input signal that is to be amplified to enable the amplifier 100 to match the impedance of the output load 164 at the predetermined frequency. In illustrative embodiments that are described below, the gain levels for the amplifier are near 10 dB over a wide band of frequencies with a strong degree of linearity. The strong degree of linearity over a wide frequency band for different power levels surpasses prior art amplifiers that cannot maintain linearity outside of narrower frequency and power ranges.

Prior art amplifiers optionally use a static output matching network to match the output impedance of an output load. The static output matching network produces an optimal impedance $Z_{Opt}$ corresponding to a specific frequency $f_0$ and the required maximum output power, $P_{Max}$. However, the prior art amplifiers experience sharp degradation in performance if the operational conditions change. For example, changes to the predetermined frequency of the amplified signal and/or power levels degrade the amplifier performance.

The tunable matching network that is depicted in the amplifier 100 incorporates both the static fixed output matching network 160 and the tunable resonator 120, which acts as a dynamic component. The fixed output matching network 160 is coupled directly to the output load 164, and matches the selected impedance for an optimal load of the transistor 104 at maximum power ($P_{Max}$) over a predetermined frequency band. The dynamic tunable resonator 120 is placed between the fixed matching network 160 and the transistor 104. The tunable resonator 120 adaptively tunes the load to different load-line impedances according to different output power. In this way, the power amplifier 100 implements band-reconfigurable and load-adaptive characteristics to operate at an optimal condition at any frequency point within the predetermined band and for different power levels power levels.

In some embodiments of the amplifier 100, the fixed matching network 160 is implemented with multi-stage L-sections to provide an optimal load-line at maximum power ($P_{Max}$), of $Z_L = Z_{Opt}(f, P_{Max})$, where $Z_{opt}$ is an optimal impedance that matches the load impedance $Z_L$, over a wide range of frequencies (f). For most of the hetero-junction transistors, e.g., GaAs HEMTs, the imaginary part of the optimal impedance increases as $P_{out}$ decreases from $P_{Max}$, while the real part remains constant. Therefore, the dynamic tunable resonator 120 is constructed using a series resonator with a fixed inductor, $L_0$ 124 and a variable capacitor (varactor 122), $C_{Var}$. When the PA is operating at $P_{Max}$, the varactor 122 is tuned to resonant with $L_0$ 124, leading to $Z_L = Z_{Opt}(f, P_{Max})$. When the power decreases, the varactor 122 capacitance is tuned dynamically to increase the imaginary component of the load-line.

Figure 2:
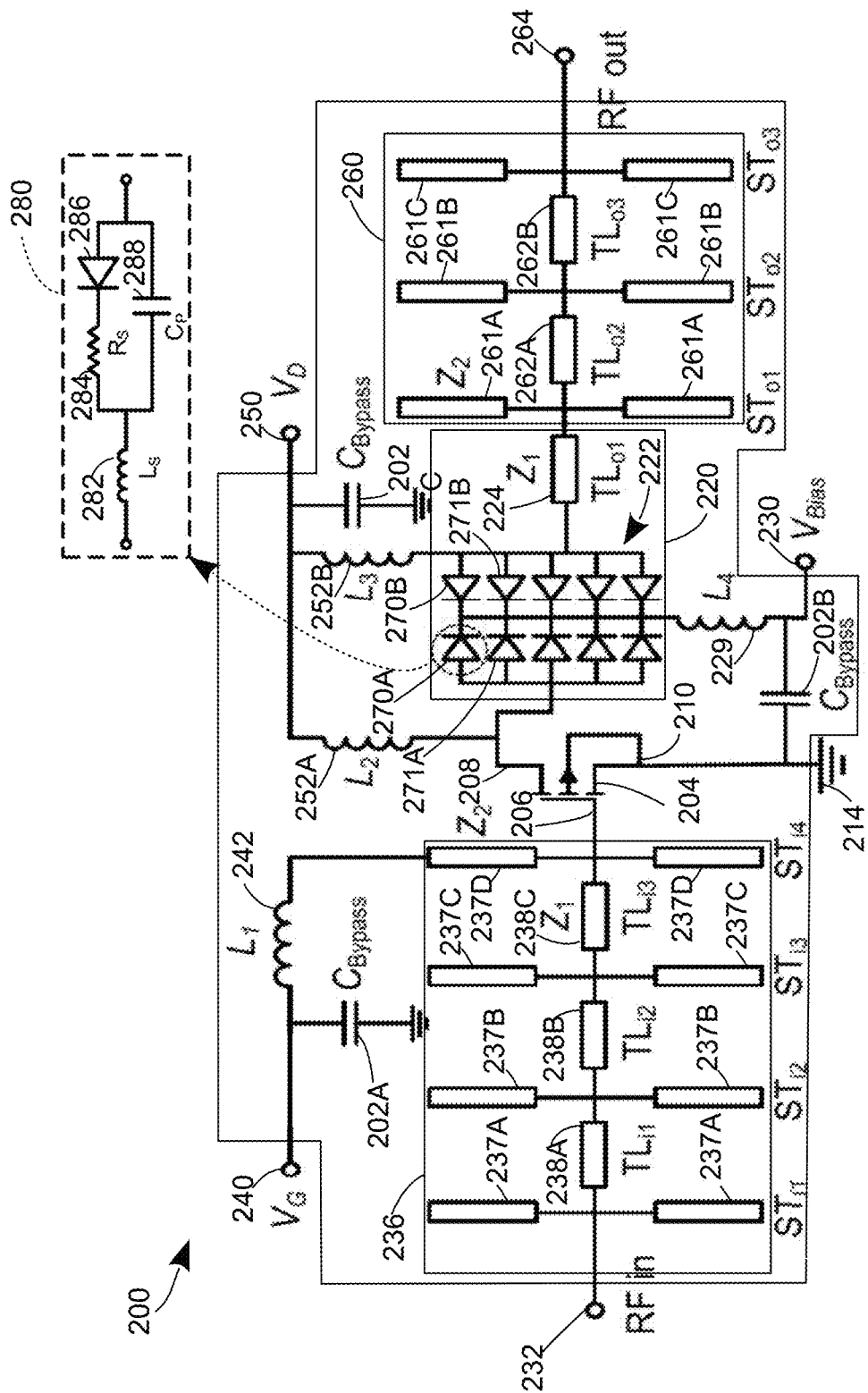
FIG. 2 is a schematic diagram of one embodiment of the amplifier electronic circuit of FIG. 1.

FIG. 2 depicts an embodiment of an amplifier electronic circuit 200 that is an illustrative embodiment of the amplifier 100 configured to handle amplification of signals in a broad range of several hundred megahertz to several gigahertz. In one configuration, the amplifier 200 is configured to amplify signals in a range of approximately 1 GHz to approximately 2 GHz, although alternative configurations of the amplifier 200 can be tuned for lower frequency ranges or higher frequency ranges, such as from 0.7 GHz to 2.7 GHz or from 500 MHz to 3 GHz. In one configuration, the amplifier 200 is used in wireless communication system that transmits voice, video, and other data.

The amplifier 200 includes the same general components and configuration as the amplifier 100 including a transistor 204, input matching network 236, tunable resonator 220, and fixed output matching network 260. FIG. 2 also depicts terminals for a gate voltage source 240, drain voltage source 250, input signal source 232, and output load 264. FIG. 2 further depicts an bias voltage source 230 ($V_{Bias}$) with that generates a bias voltage to control the operation of a varactor 222 in the tunable resonator 220. The bias voltage source 230 is connected to the varactor 222 through an inductor 229. In the configuration of FIG. 2, the drain voltage source 250 is also connected to an output of the varactor 222 through another inductor 252B. The electronic circuit 200 also includes bypass capacitors 202A, 202B, and 202C that provide isolation to the gate voltage source $V_G$, bias voltage source $V_{Bias}$, and drain voltage source $V_d$, respectively. The amplifier 200 is configured to operate as a band-reconfigurable amplifier over a wide frequency band and to be a load configurable amplifier to match different load impedance levels. During operation, the voltage output level of the bias voltage source $V_{Bias}$ is adjusted to increase or decrease the capacitance of the varactor 222 within a predetermined range. The changes to the capacitance of the varactor 222 enable the tunable resonator 120 to be tuned to a wide range of resonant frequencies that correspond to the selected frequencies in the input signal 132 that are amplified for the output load 164.

In one embodiment of the amplifier 200, the transistor 204 is embodied as a p-type high-electron-mobility transistor (pHEMT). An example of a suitable pHEMT transistor is a gallium-arsenide (GaAs) transistor, and an example of a commercially available pHEMT transistor embodiment is the MRFG35010 transistor that is manufactured by Freescale Semiconductor, Inc. of Austin, Tex. The pHEMT transistors are suited to use in high-frequency amplifiers that operate in frequency ranges of hundreds of megahertz up to several gigahertz. In alternative embodiments, different types of transistor can be used in high frequency ranges or in lower frequency ranges for different operational configurations of the amplifier 200. For example, HBT, GaAs, CMOS, GaN, SiC, HEMT, SOI, SiGe, LDMOS, and stacked variants of these transistor types are used in alternative embodiments. In the amplifier 200, the transistor 204 includes a gate 206 that is connected to an output of the input matching network 236 and the gate voltage source 250 via an inductor 242. The transistor 204 includes a drain 208 that is directly connected in series to the input of the varactor 222 in the tunable resonator 220 and further connected to the drain voltage source terminal 250 through an inductor 252A. While FIG. 2 depicts a configuration of the tunable resonator 220 where the input of the varactor 222 is directly connected to the drain 208 in the transistor 204 and the output of the varactor 222 is connected in series to an input of the inductor 224, in another configuration the order is reversed with the input of the inductor 224 connected directly to the drain 208 and to the drain voltage source 250 through the inductor 252A, the output of the inductor 224 connected in series to the input of the varactor 222, and the output of the varactor 222 connected in series to an input of the fixed output matching network 260. The transistor 204 further includes a source 210 that is connected to ground 214.

The amplifier 200 includes a varactor 222 that further comprises an array of varactor elements. As used herein, the term "varactor element" refers to an individual varactor that is arranged with other varactor elements and optionally other circuit elements to form a larger circuit that operates as a varactor. In the embodiment of the amplifier 200, the varactor 222 includes a plurality of varactor element pairs, such as the varactor element pairs 270A-270B and 271A-271B. An example of a commercially available varactor that is suited for use as a varactor element is the MTV4090-12-1 varactor sold by the Aeroflex, Inc. of Plainview, N.Y. FIG. 2 depicts an internal schematic representation 280 for each of the varactor elements in the varactor 222. Each varactor element is characterized by an inductor 282 that is connected in series with a combination of a resistor 284 in series with a diode 286 that are both connected in parallel with a capacitor 288. The inductor 282 corresponds to a parasitic inductance in the varactor element. In one embodiment, the parasitic inductor 282 has a value of 1.5 nH and the resistor 284 has a value of 1.2Ω. In alternative embodiments, the varactor 222 includes one or more varactor elements formed from silicon, on sapphire, silicon on insulator, compound semiconductor, III-V, GaAs, MEMS, or ferroelectric varactors. In particular, the configuration of the amplifier 200 enables high linearity levels (e.g. ACLR is <−35 dB) using silicon and silicon on insulator varactors.

In the varactor 222, each varactor element pair is connected in anti-series, which is to say that the cathodes of each pair of varactor elements are connected in series while the anode of one varactor element is connected to the drain 208 while the anode of the other varactor element is connected to the inductor 224 in the tunable resonator 220. For example, in the varactor element pair 270A and 270B the anode of varactor 270A is connected to the drain 208, the anode of the varactor 270B is connected to the inductor 224, and the cathodes of the varactor elements 270A and 270B are connected together. The varactor element pair 271A and 271B are connected in a similar arrangement and the pairs of varactor elements are connected to each other in parallel in the varactor 222. In the embodiment of FIG. 1, the bias voltage source $V_{Bias}$ is connected to the cathodes in each pair of varactor elements. Thus, a single bias voltage from the bias voltage source $V_{Bias}$ controls the overall capacitance of the entire varactor 222, and the varactor 222 with multiple varactor elements is controlled in the same manner as a single varactor. While FIG. 2 depicts a varactor 222 that includes five pairs of varactor elements, alternative embodiments include only a single varactor or one or more pairs of varactor elements.

The arrangement of varactor elements in the varactor 222 enables the varactor 222 to continue operation with greater levels of voltage swing and power levels than using only a single varactor element. In the varactor 222, the voltage swing is equally shared by two diodes in series, which leads to 4 (22) times enhancement of power handling capability. However, the parasitic inductance effect is also doubled by this series topology. To reduce the effects of parasitic inductance due to the inherent parasitic inductance 282 each varactor element and the soldering connection, the varactor 222 includes 5 pairs of varactor elements in the anti-series configuration of FIG. 2 that act as a single varactor. The parasitic inductance results in negative effect on the matching accuracy. The series parasitic inductance in the varactor 222 optionally have a beneficial effect since the parasitic inductances are in-series with the varactor elements and optionally provide some or all of the inductance of the inductor 224 in the tunable resonator 220.

In the amplifier 200, the input matching network 236 and the fixed output matching network 260 are both embodied using a combination of shunt open-stubs and transmission lines that act as capacitors and inductors, respectively, in the matching networks. The combination of a shunt open-stub and transmission line forms an inductor-capacitor (LC) circuit, and multiple LC circuits connected in series form a multi-stage matching network. A shunt open-stub is an elongated conductor that is electrically connected to other components in an amplifier or other electric circuit at only one location with two ends of the shunt open-stub being left electrically isolated from the circuit. An example embodiment of a shunt open-stub is an elongated electrical conductor trace that is formed on an electrically insulated printed circuit board (PCB) or other suitable substrate where the shunt open-stub trace is connected to a transmission line electrical trace only at a location at or near the center of the shunt open-stub. An example of a suitable PCB is a Rogers Duroid 5880LZ formed with a thickness of 0.5 mm that is sold commercially by the Rogers Corporation of Rogers, Conn. A transmission line is also and electrical conductor that is formed on the PCB that connects one or more of the shunt open-stubs together. In one embodiment, the inductor 224 in the tunable resonator 220 is also a transmission line. The electrical conductor traces that form the shunt open-stubs and transmission lines are formed from copper, aluminum, or another suitable electrical conductor. As is known in the art, the length and width of the traces that form the shunt open-stubs and the transmission lines affect the electrical impedances of these components.

In the amplifier 200, the fixed matching network 260 includes shunt open-stubs 261A, 261B, and 261C, which are each formed with an impedance of approximately 20Ω, and lengths of 26 mm, 23 mm, and 12 mm, respectively. The matching network 260 also includes transmission lines 262A and 262B that are formed with an impedance of 90Ω and lengths of 2 mm and 6.5 mm, respectively. In the embodiment of the amplifier 200, the tunable resonator 220 and the fixed output matching network 260 form a tunable output matching network that is configured to matching a 5Ω output impedance of the amplifier 200 to an output load 264 that has an impedance of 50Ω at a frequency of approximately 1.5 GHz. The fixed output matching network 260 also acts as a low-pass filter. While FIG. 2 depicts LC circuits formed from the transmission lines and shunt-open stubs, in alternative embodiments discrete inductor and capacitor components can be used to implement a fixed matching network.

In the amplifier 200, the input matching network 236 also includes a combination of shunt open-stubs 237A-237D and transmission lines 238A-238C that form capacitors and inductors, respectively, in the input matching network 236. As described above, the input matching network 236 is configured to match the impedance of an input signal source 232 with the input impedance of the amplifier 200 and acts as a low-pass filter on the input signal. In the example of the amplifier 200, the input matching network 236 includes four stages formed from the four shunt open-stubs 237A-237D and transmission lines 238A-238C while the fixed output matching network only includes three stages formed from the 261A-261C and transmission lines 262A-262B. The input matching network 236 includes the additional stage because the input impedance of the transistor 204 varies within a larger range from 5+2j at 1 GHz to 2-5j at 2 GHz. Additionally, some transistor embodiments are sensitive to the input impedance at higher frequencies, e.g. >1.8 GHz, which affects the gain and power added efficiency (PAE) significantly. Therefore, the input impedance matching network 236 is configured to provide the most accurate level of input impedance near the upper edge of the operational frequency band for the amplifier 200, which is near 2 GHz in the illustrative embodiment of FIG. 2. As is known in the art, while additional stages to a matching network increase the complexity of designing and manufacturing the matching network, the additional stages also enable greater accuracy in matching the impedance between an input and output. Consequently, in the embodiment of FIG. 2 the input matching network 236 includes four stages, while the fixed output matching network 260 is operable using only three stages. Of course, alternative amplifier configurations include greater or fewer stages for the input matching network and fixed output matching network for different operating modes, and the inductors and capacitors in the both the input matching network 236 and the fixed output matching network 260 optionally include discrete (lumped) inductors and capacitors instead of or in addition to the transmission lines and shunt open-stubs that are depicted in FIG. 2. Examples of alternative inductor and capacitor embodiments include on-chip components (e.g., CMOS, GaAs MMIC), integrated passive devices (IPD), surface mount devices (SMD), laminate, and PCB board.

Figure 3:
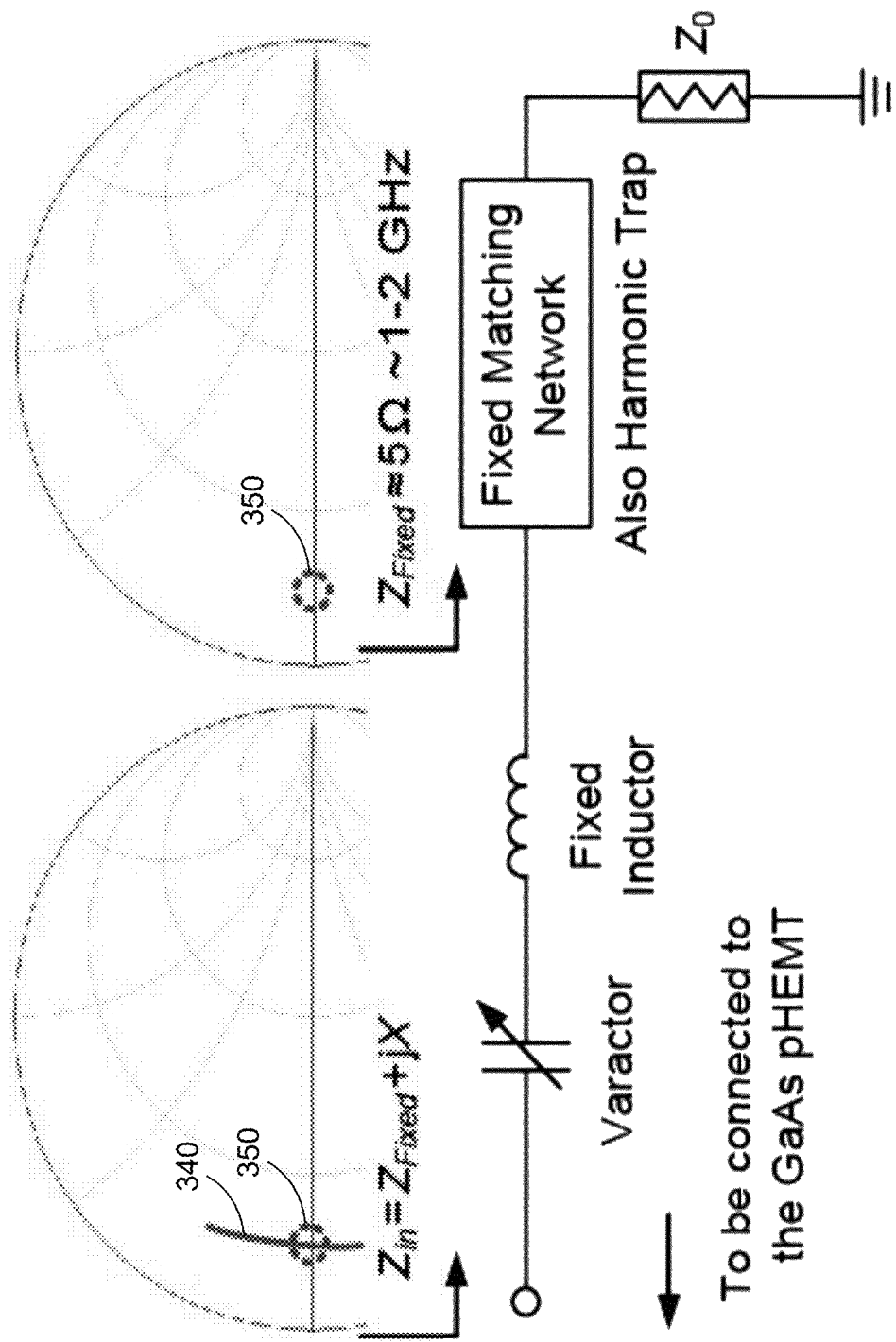
FIG. 3 is a schematic diagram and set of Smith chart impedance plots depicting the operation of a tunable resonator and fixed output matching network in the amplifiers of FIG. 1 and FIG. 2.
Figure 4:
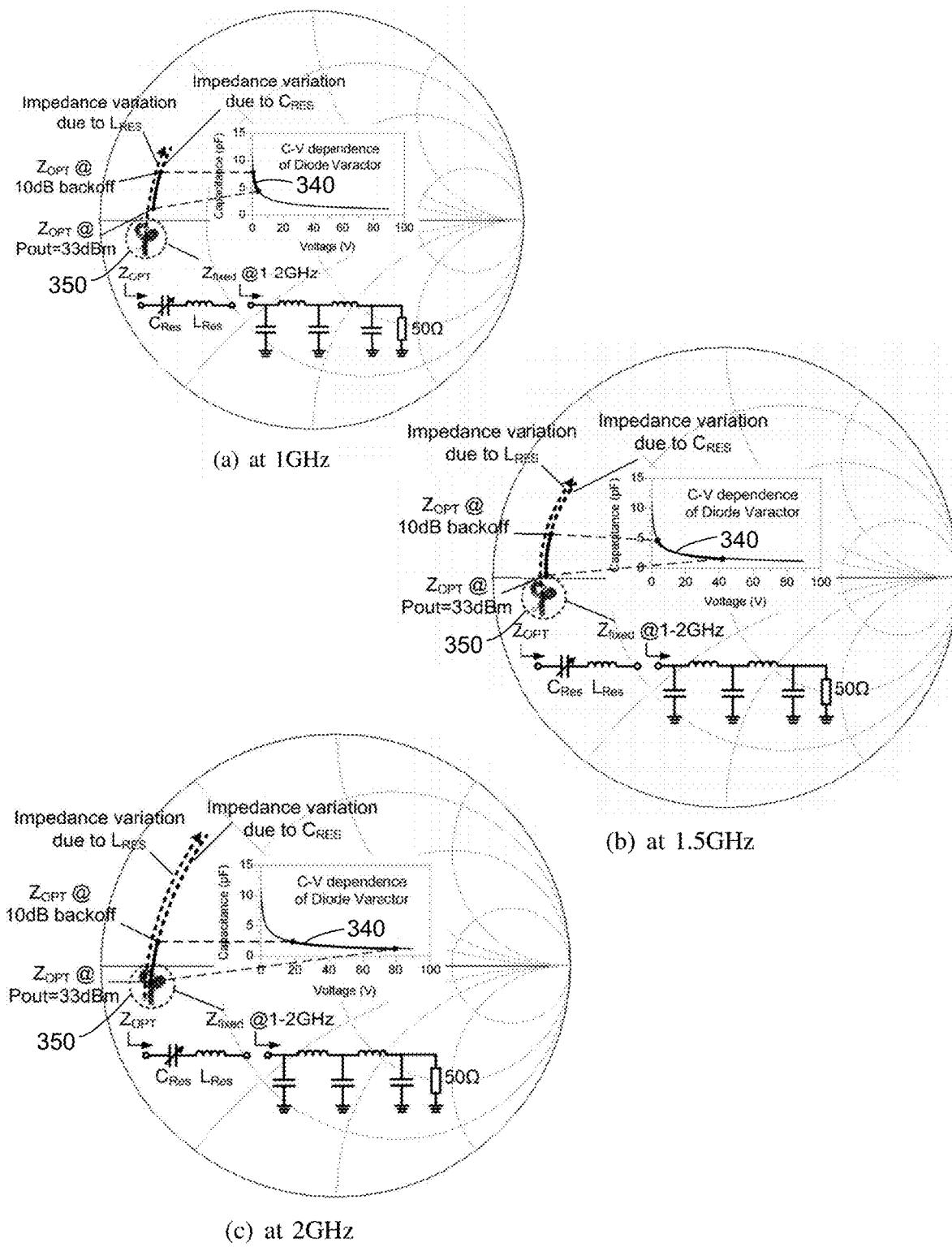
FIG. 4 is a set of Smith chart impedance diagrams depicting the operation of the tunable resonator and fixed output matching network in the amplifiers of FIG. 1 and FIG. 2 at operating frequencies of 1 GHz, 1.5 GHz, and 2 GHz.

As described above, the tunable resonator 220 and the fixed output matching network 260 form a tunable matching network for amplification of different frequencies and power output levels during operation of the amplifier 200. FIG. 3 and FIG. 4 depict Smith charts that show the operation of the tunable matching network within 1 GHz to 2 GHz frequency range. In FIG. 3 and FIG. 4, the plots 340 represent the covered dynamic load modulation (DLM) locus corresponding to the capacitance value of the varactor in each configuration. The fixed matching network 260 first brings 50Ω to the region marked by the circles 350, where the impedance is almost frequency stable. The tunable resonator 220 brings the impedance to the optimum point in respect of frequency and power level as the bias voltage source $V_{Bias}$ changes the bias voltage of the varactor diode, e.g. $V_{min}$=1V corresponding to ZOPT of 0.2 W output power at 1 GHz, $V_{max}$=80V corresponding to ZOPT of 2 W output power at 2 GHz. Therefore, as shown in FIG. 4, the dynamic load modulation locus is covered over the entire frequency range of 1-2 GHz band in the illustrative embodiment of the amplifier 200. Additionally, the tunable resonator 220 does not resonate in the same manner as an ideal series LC resonator because the reactances of the inductor and the capacitor do not perfectly compensate each other. Instead, the tunable resonator 220 can be characterized by a resonating component including the varactor 222, and a matching component that includes the inductor 224 and further includes the fixed output matching network 260. The topology of the amplifier 200 enables flexibility in the selection of the inductance value for the inductor 224.

Figure 5:
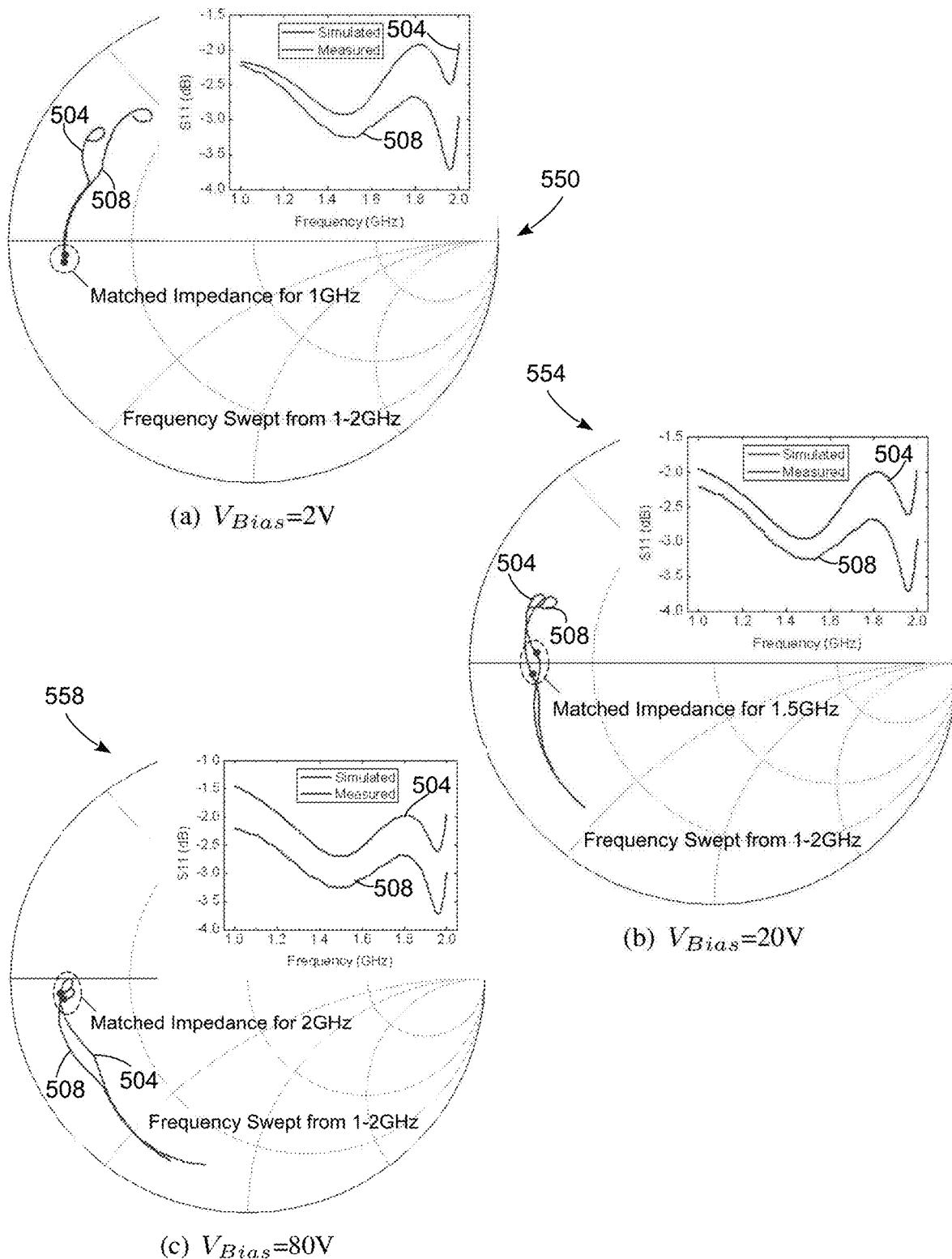
FIG. 5 is a set of Smith chart impedance diagrams depicting the operation of the tunable resonator and fixed output matching network in the amplifiers of FIG. 1 and FIG. 2 for bias voltages that control a varactor in the tunable resonator at 2V, 20V, and 80V.

FIG. 5 depicts Smith charts for simulated and measured impedance matching results for the tunable matching network in the amplifier 200 using different voltage bias levels from the bias voltage source $V_{Bias}$ to the varactor 222. As is known in the art, the capacitance of the varactor 222 drops in response to increased bias voltage levels. Additionally, the larger bias voltage levels are used when the amplifier 200 operates at or near the maximum output power level since the increased power output level increases the voltage swing across the varactor 222 and reduces the effectiveness of the bias voltage $V_{Bias}$. In FIG. 5, the plots 504 and 508 depict simulated and measured results, respectively, for the matched impedance over a frequency range of 1 GHz to 2 GHz for $V_{Bias}$ levels of 2V (graph 550), 20V (graph 554), and 80V (graph 558).

While FIG. 2 depicts an illustrative embodiment that uses shunt open-stubs to form capacitors and transmission lines to form inductors in an amplifier, alternative configurations can use any other suitable selection of capacitor and inductor components to form the matching networks. The particular component selection in the matching networks 236 and 260 varies to accommodate input and output loads with different impedance levels in the operational frequency range of the amplifier 200.

Figure 6:
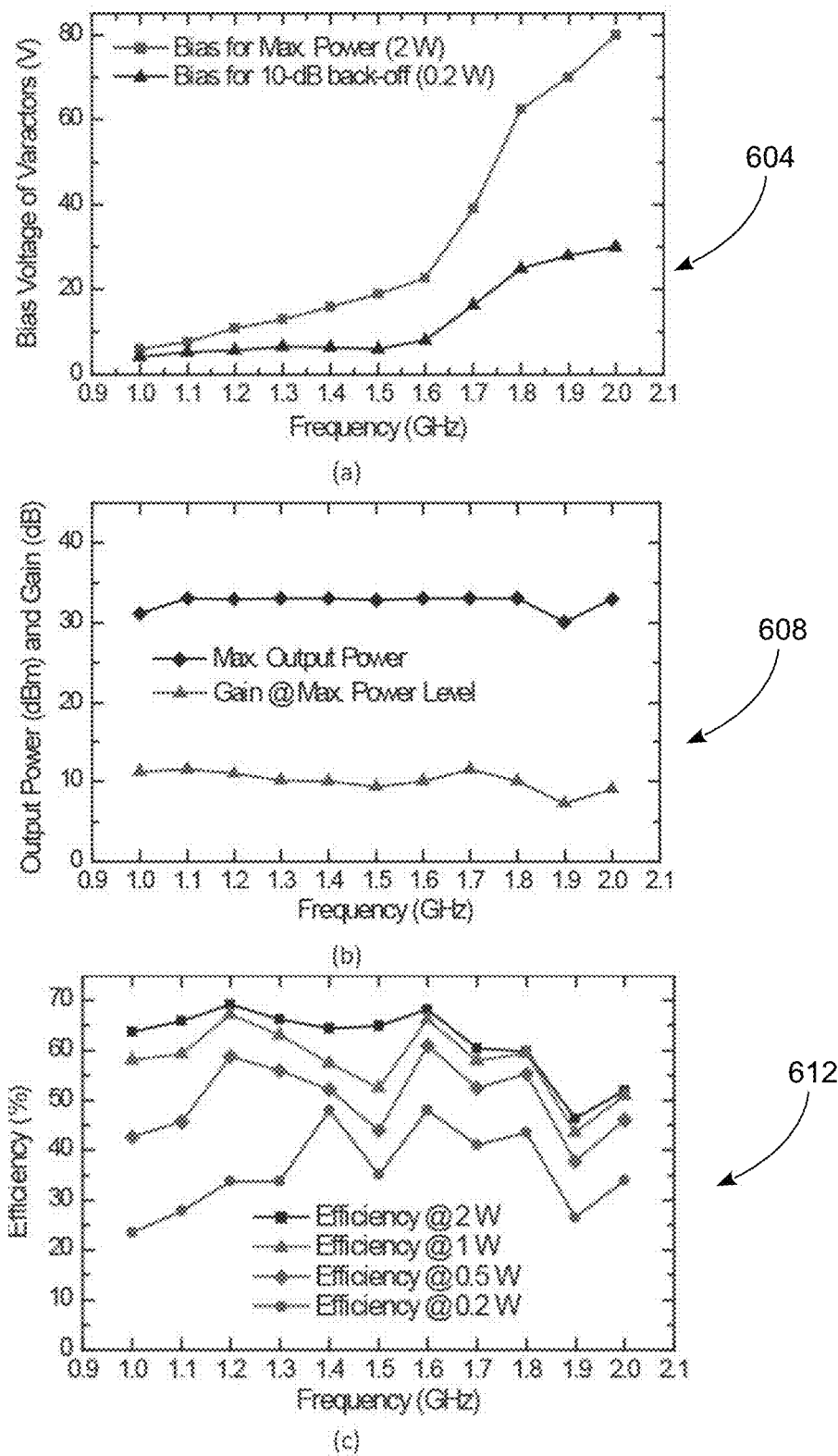
FIG. 6 is a set of graphs depicting bias voltage levels and efficiency characteristics for the operation of the amplifier of FIG. 2.
Figure 7:
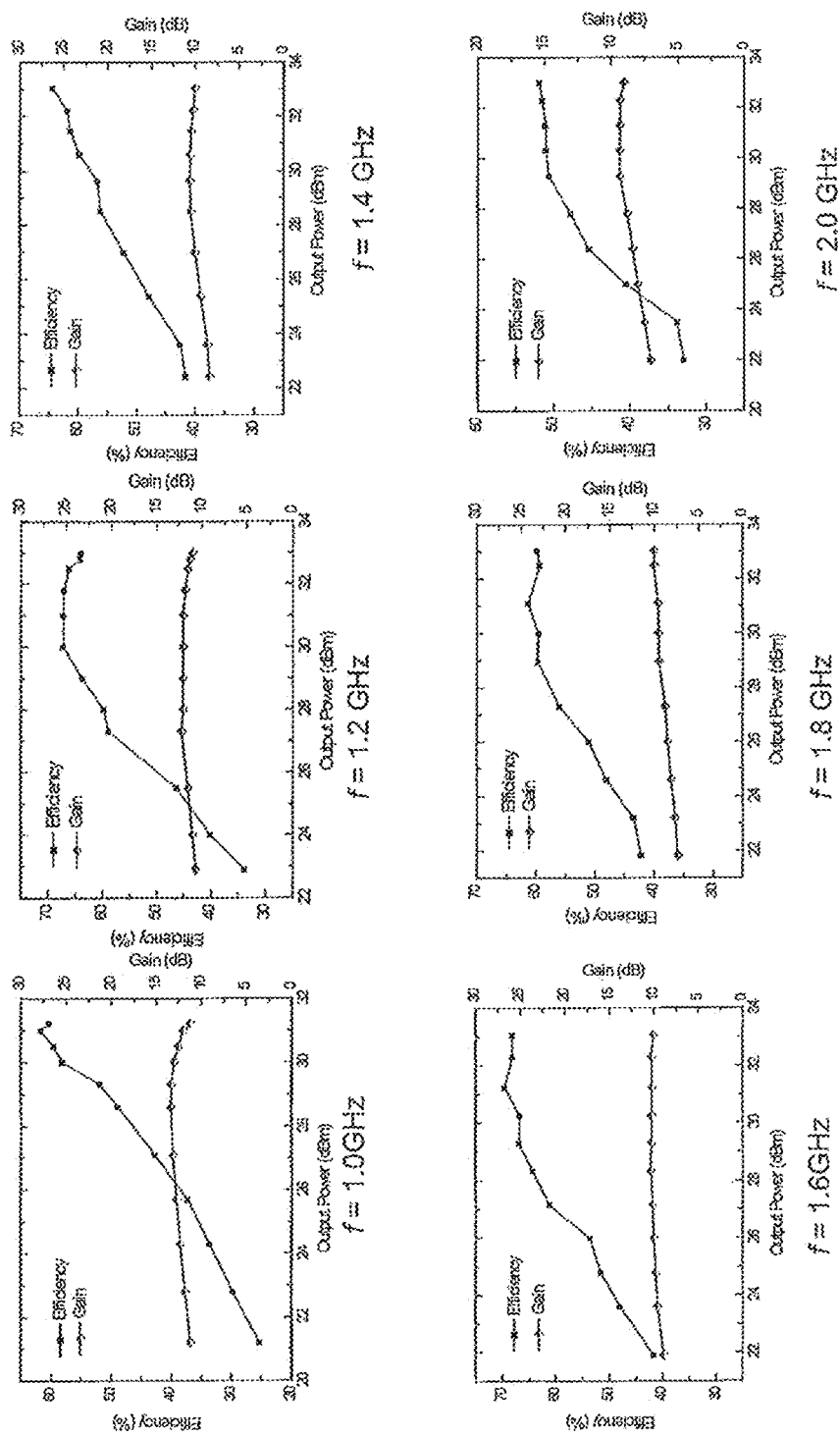
FIG. 7 is a set of graphs depicting gain and efficiency levels during dynamic load modulation operations with the amplifier of FIG. 2.

FIG. 6 and FIG. 7 include performance graphs depicting the gain and efficiency levels of the amplifier 200 over a frequency range of 1 GHz to 2 GHz and an output power level of 0.2 watts to 2 watts. FIG. 6 depicts a graph 604 of the voltage bias levels for control of the varactor 222 at different frequencies at output power levels of 0.2 watts and 2 watts. In FIG. 6, the graph 608 depicts the output power levels in dBm and gain levels in dB at the maximum output power level of 2 watts. The graph 608 depicts strong linearity in the gain for the amplifier 200 across the range of frequencies from 1 GHz to 2 GHz with the gain remaining in a relatively narrow range around 10 dB. The stable gain across a wide frequency band exceeds the capabilities of prior art amplifiers that typically only have linear gain across much narrower frequency bands. The graph 612 depicts efficiency levels for the amplifier 200 at different power output levels ranging from 0.2 watts to 2 watts across the frequency range from 1 GHz to 2 GHz. The illustrative embodiment of the amplifier 200 reaches the highest average level of efficiency at the maximum configured power output level of 2 watts. FIG. 7 depicts a series of graphs that show the results of dynamic modulation of the load over a range of 1.1 GHz to 1.9 GHz to show the efficiency and gain of the amplifier 200 under a wide range of operating conditions.

Figure 8:
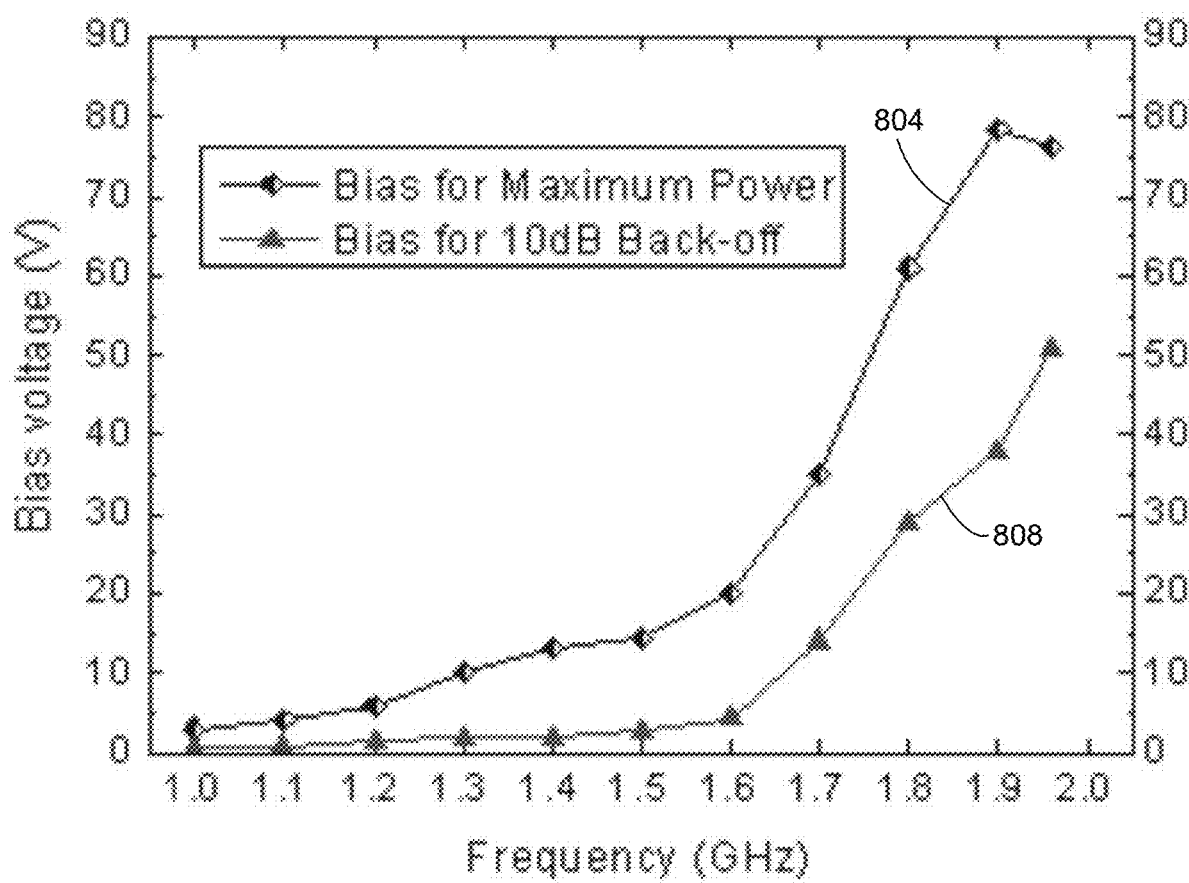
FIG. 8 is a graph that depicts bias voltage levels for different maximum power and 10 dB back-off levels for the amplifiers of FIG. 1 and FIG. 2.

FIG. 8 depicts optimum bias voltage levels over a frequency range of 1 GHz to 2 GHz for the amplifiers 100 and 200 during maximum power operation (plot 804) and in a 10 dB back-off mode (plot 808). FIG. 7 plots the measured efficiency and gain of the amplifiers 100 and 200 on different power levels in a frequency band of 1.1-1.9 GHz. At each frequency point, the significant efficiency enhancement can be seen at power back-offs. The efficiency improvement at back-off power levels is typically >15% compared to the PA in power back-off using a fixed load (statically biased at the maximum Pout point at each frequency point). As a result of this dynamic load modulation, the amplifiers 100 and 200 operate with a 30%-65% efficiency over a 10 dB power range for the entire bandwidth of 1 GHz to 2 GHz. The reduction of DC power consumption using the optimization is set forth in the following equation:

$$P_{DC,Reduction} = \frac{P_{out}}{Eff \cdot \text{static}} - \frac{P_{out}}{Eff \cdot \text{dynamic}}.$$

Typically, the increase of efficiency from 20% to 35% at 0.2 W power level (10 dB back-off) corresponds to the reduction of DC power consumption of 0.43 W.

Figure 9:
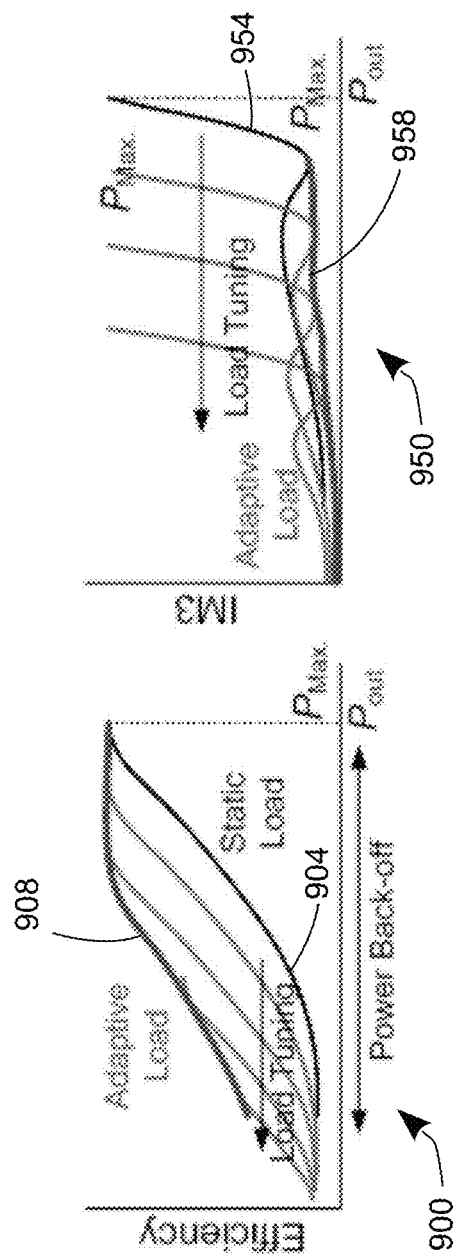
FIG. 9 is a set of graphs showing load adaptation for the amplifiers of FIG. 1 and FIG. 2 at different power levels.

FIG. 9 depicts the operation scenario of dynamic load-line adaption that is described above with reference to the tunable matching networks in the amplifiers 100 and 200. In FIG. 9, the graph 900 includes a plot 904 that represents the power amplifier performance versus power when the tunable matching network is tuned for the maximum output power. As the power decreases, the load-line is adjusted through tuning the tunable matching network to move the efficiency-power curve towards the left side, as depicted by the adaptive load plot 908, to enable high efficiency operation at different power back-off levels. In turn, the efficiency-optimal condition at different output power levels $P_{OUT}$ is achieved by tracking the upper edge of this group of curves. Moreover, the load-line adaption can also lead to desired linearity performance, as shown in the graph 950. The curve 954 denotes the third-order intermodulation over power of the static load-line case which is set for $P_{Max}$. The graph 950 presents a deep notch at the power slightly lower than $P_{Max}$, denoting the best linearity point. The deep notch moves towards left as the load-line is tuned on the plot 958, which indicates that the linearity-optimal point can be tracked at different $P_{OUT}$ by properly controlling the load-line. The efficiency-optimal and linearity-optimal points are not exactly the same. In realistic applications, a trade-off between linearity and efficiency is necessary when tuning the load-line according to a specific output power level $P_{OUT}$.

Figure 10:
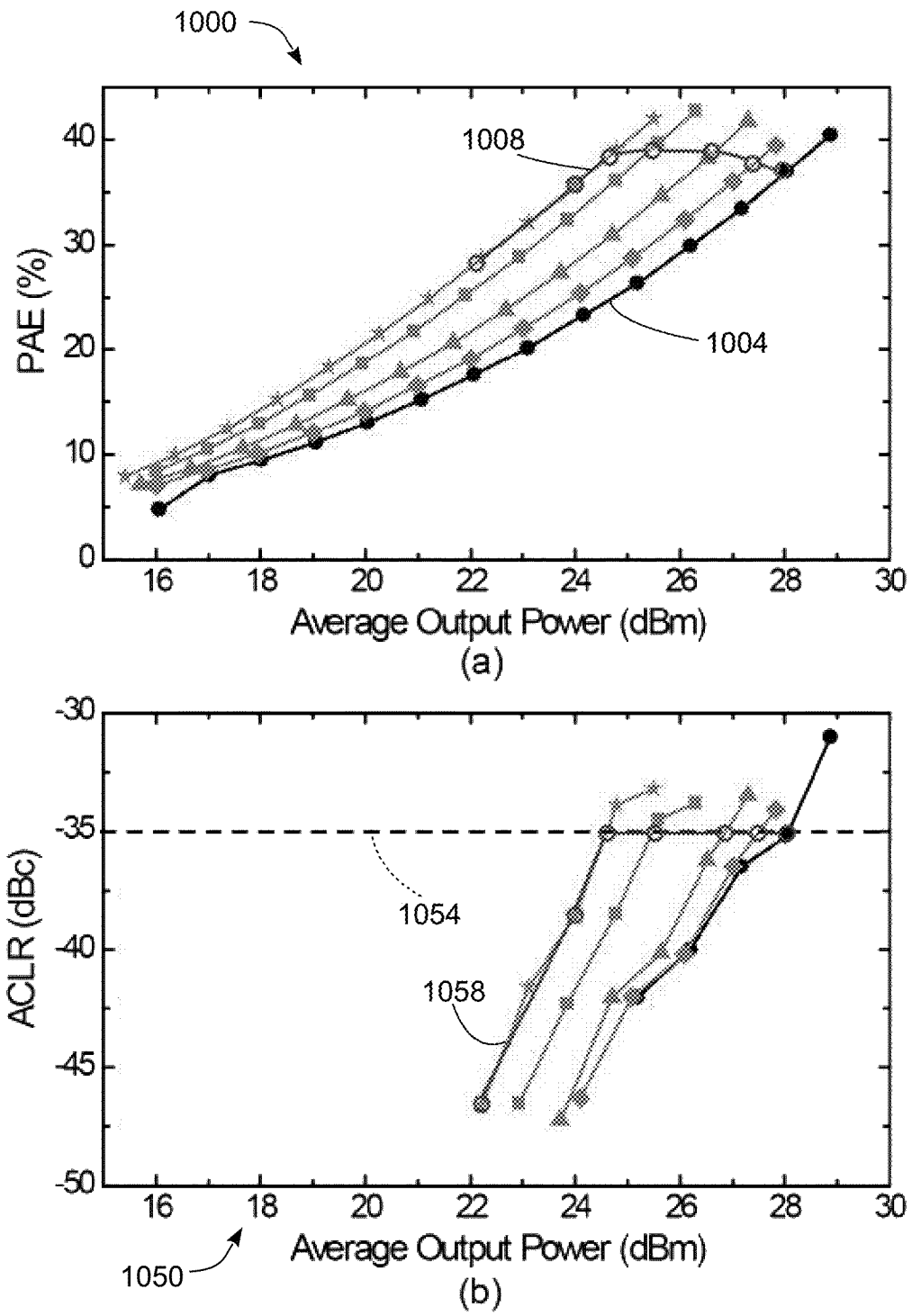
FIG. 10 is a set of graphs depicting power added efficiency and adjacent channel leakage ratios for the amplifiers of FIG. 1 and FIG. 2 at different power levels.

FIG. 10 is an illustrative graph depicting linearity in the output from the amplifiers 100 and 200. The illustrative examples of FIG. 10 correspond to amplified communication signals for waveforms that are used in the long term evolution (LTE) wireless communication standard, although the amplifiers 100 and 200 can be used for amplification of other signals as well. The peak-to-average ratio (PAR) of the input signal is around 8 dB, and the center frequency is around 1.72 GHz. The graph 1000 depicts a test that is conducted with the optimal load condition for the maximum power level. The measured power-added-efficiency (PAE) versus output power is plotted as indicated by the curve 1004 in the graph 1000. Then, the load is changed and different curves are generated in grey showing the different operating condition for different power level. The graph 1050 depicts the linearity performance using an adjacent channel leakage ratio (ACLR) metric. Given the fact that <−35 dB of ACLR is required by the 4G communication standard. The interception points are extracted as indicated in the graph 1050 along line 1054 and the plot 1058, which show the optimal operational conditions at different power level for 4G application. Using interpolation, the respective PAE is extracted and depicted as plot 1008 in the graph 1000. The results from FIG. 10 indicate that the amplifiers 100 and 200 are suitable for linear operation with high efficiency while meeting the specifications for signal amplification in the LTE standard and in other wireless communication standards.

While FIG. 3-FIG. 10 depict operational characteristics for embodiments of the amplifiers 100 and 200 over a frequency range of 1 GHz to 2 GHz and output power levels of 0.2 W to 2 W, these operational characteristics are merely illustrative and non-limiting examples of the operation of the amplifiers 100 and 200 under certain configurations. For example, in alternative embodiments the tunable matching network is configured to enable the amplifiers to operate over different frequency ranges, which include lower frequency ranges in the hundreds of megahertz (e.g. 500 MHz-1.5 GHz frequency range) or higher frequency ranges (e.g. 1.7 GHz-2.7 GHz frequency range). While a 1 GHz tunable frequency band is described above for illustrative purposes, alternative embodiments can include broader frequency bands or narrower frequency bands for different amplifier applications (e.g. 500 MHz-1 GHz, 1 GHz-1.7 GHz, or 1.7 GHz-3.0 GHz). Additionally, while the amplifier 200 is described above in power output modes between 0.2 W and 2 W, the output power levels from different amplifier configurations can include a range of power output levels including both lower minimum power output levels (e.g. 0.002 W-2 W), and/or higher maximum output power levels (e.g. 0.002 W-5 W). More generally speaking, the operational power level for different embodiments of the amplifiers 100 and 200 vary from peak power (e.g., <10 W) to more than 10-dB below the peak power (i.e., >10-dB power back-off).

Figure 11:
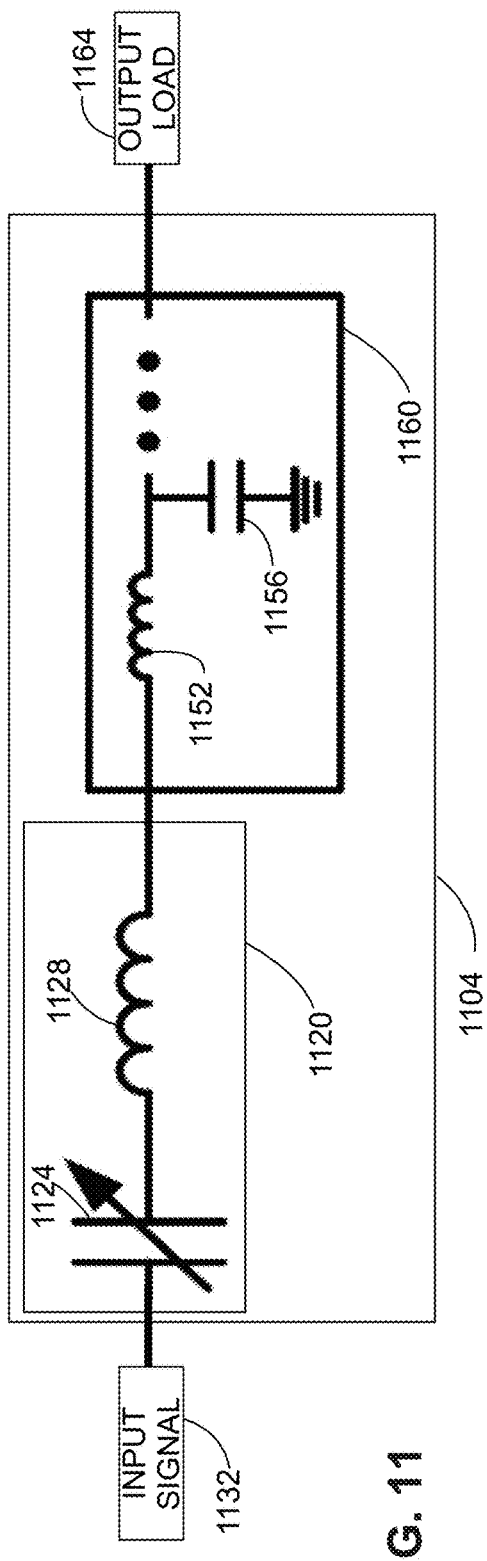
FIG. 11 is a schematic diagram of an impedance matching electronic circuit.

While the embodiments depicted are described in conjunction with a power amplifier, the tunable matching network can be incorporated into other circuits as well. FIG. 11 depicts the tunable matching network circuit 1104 that includes the tunable resonator 1120 and fixed output matching network 116. An input signal 1132 is provided with a frequency in a predetermined frequency range and power level in a predetermined range of power levels. The tunable resonator 1120 includes a variable capacitor 1124 that is connected in series with an inductor 1128. While FIG. 11 depicts a configuration of the tunable resonator 1120 where the input of the variable capacitor (varactor) 1124 is directly connected to the input signal 1132 and the output of the varactor 1124 is connected in series to an input of the inductor 1128, in another configuration the order is reversed with the input of the inductor 1128 connected directly input signal 1132, the output of the inductor 1128 connected in series to the input of the varactor 1124, and the output of the varactor 1124 connected in series to an input of the fixed output matching network 1160. The fixed output matching network 1160 includes one or more stages with LC circuits such as the inductor 1152 and capacitor 1156. The output of the fixed matching network 1160 is connected to an output load 1164. During operation, the capacitance of the variable capacitor 1124 is adjusted to enable the output impedance of the tunable matching network to generate an output from the input signal 1132 that matches the impedance of the load 1164 over a wide frequency band and at different power levels. The tunable output matching circuit 1104 provides impedance matching with a high degree of linearity over a wide frequency band and for different power levels.

Figure 12:
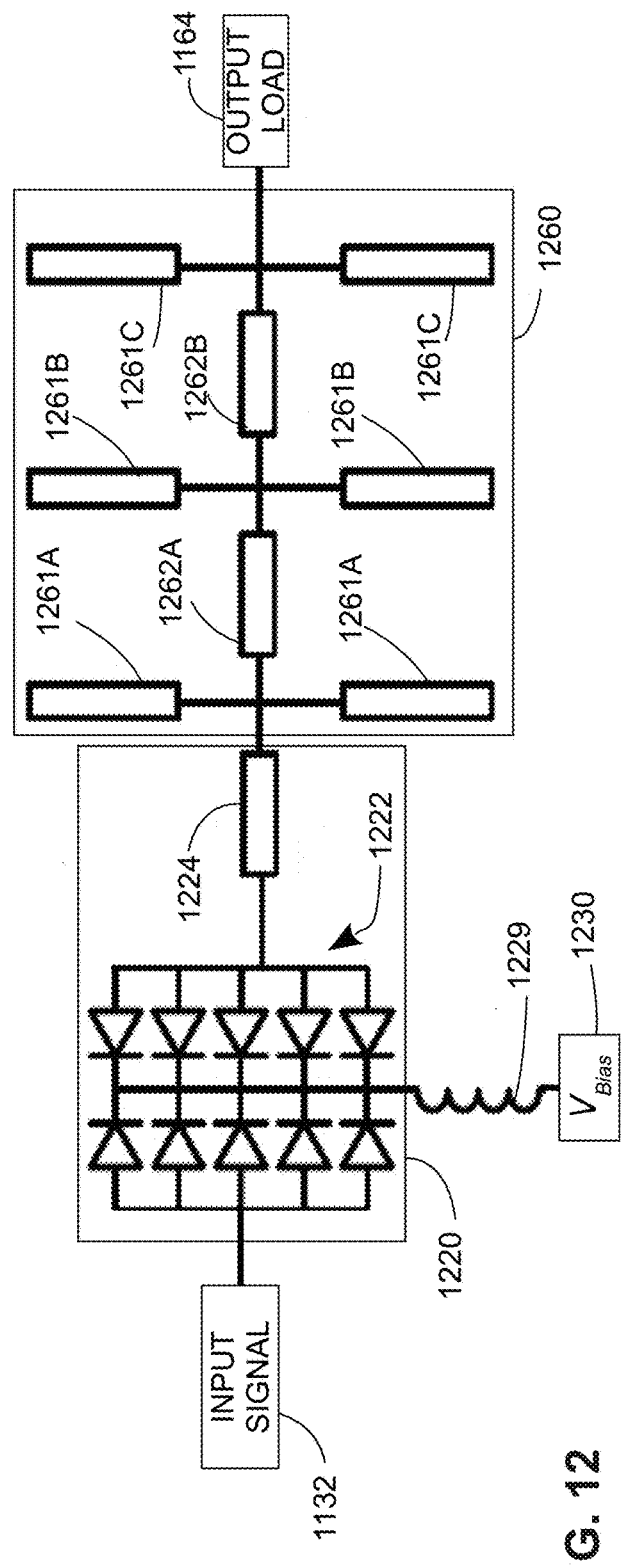
FIG. 12 is a schematic diagram of one embodiment of the impedance matching electronic circuit of FIG. 11.

FIG. 12 depicts an embodiment of the tunable matching network circuit of FIG. 11. The tunable matching network circuit 1200 in FIG. 12 includes the tunable resonator 1220 and fixed output matching network 1260. The tunable resonator 1220 includes an input that receives the input signal 1132 to an input of a varactor 1222, which is connected in series to an inductor 1224. While FIG. 12 depicts a configuration of the tunable resonator 1220 where the input of the varactor 1222 is directly connected to the input signal 1132 and the output of the varactor 1222 is connected in series to an input of the inductor 1224, in another configuration the order is reversed with the input of the inductor 1224 connected directly input signal 1132, the output of the inductor 1224 connected in series to the input of the varactor 1222, and the output of the varactor 1222 connected in series to an input of the fixed output matching network 1160. The varactor 1222 is operated by a bias voltage source $V_{Bias}$ 1230 through an inductor 1229 to adjust the capacitance of the varactor 1222 and control the frequency of the tunable resonator 1220. The varactor 1222 includes the same array of varactor elements as described above in the varactor 222 of FIG. 2. The output of the inductor 1224 in the tunable resonator 1220 is connected in series to an input of the fixed output matching network 1260. The fixed output matching network 1260 includes the open-stubs 1261A, 1261B, and 1261C that act as capacitors and transmission lines 1262A and 1262B that act as inductors to form LC circuits. In the illustrative embodiment of FIG. 12, the fixed output matching network 1260 is configured as a three-stage LC network in a similar manner to the fixed output matching network 260 of FIG. 2, although alternative embodiments can include a greater or lesser number of stages. The output of the fixed matching network 1260 is connected to the output load 1164.

It will be appreciated that variants of the above-described and other features and functions, or alternatives thereof, may be desirably combined into many other different systems, applications or methods. Various presently unforeseen or unanticipated alternatives, modifications, variations or improvements may be subsequently made by those skilled in the art that are also intended to be encompassed by the following claims.

What is claimed:

1. An electronic circuit comprising an input matching network, a fixed output matching network, a transistor, and a tunable resonator, the transistor comprising:
    a gate connected to the input matching network;
    a source connected to ground; and
    a drain directly connected to an input of the tunable resonator; and the tunable resonator comprising:
    a varactor; and
    an inductor connected in series to the varactor; and
    an output of the tunable resonator being connected to an input of the fixed output matching network; and
    wherein the varactor is connected to a bias voltage source that generates a bias voltage to adjust a capacitance level of the varactor between a predetermined minimum capacitance and a predetermined maximum capacitance.

2. The electronic circuit of claim 1, the varactor and the inductor further comprising:
    an input in the varactor directly connected in series to the drain of the transistor and the input of the varactor being configured to be connected to a drain voltage source; and
    an input of the inductor connected in series to an output of the varactor with an output of the inductor being connected in series to the input of the fixed output matching network.

3. The electronic circuit of claim 1 wherein the transistor further comprises a gallium-arsenide p-type high-electron-mobility transistor (pHEMT).

4. The electronic circuit of claim 1 wherein a ratio of the predetermined maximum capacitance and the predetermined minimum capacitance of the varactor is approximately eight to one.

5. The electronic circuit of claim 1, the fixed output matching network further comprising:
   at least one shunt open-stub connected to the output of the inductor in the tunable resonator; and
   at least one transmission line connected to the at least one shunt open-stub, the at least one transmission line being configured to be connected to an output load.

6. The electronic circuit of claim 5 wherein the fixed output matching network matches an effective impedance of the output load to an impedance of the transistor at a predetermined output frequency.

7. The electronic circuit of claim 6 wherein the predetermined output frequency is in a range of approximately 500 MHz to 3 GHz.

8. The electronic circuit of claim 1 wherein the output signal is generated with an adjacent channel leakage ratio that is less than −35 dB.

9. The electronic circuit of claim 1 wherein the transistor further comprises a transistor selected from the list of: HBT, GaAs, CMOS, GaN, SiC, HEMT, III-V, SOI, SiGe, LDMOS, and stacked transistor variants.

10. The electronic circuit of claim 5 wherein the at least one transmission line has a first impedance and the at least one shunt open-stub has a second impedance, the first impedance being greater than the second impedance.

11. The electronic circuit of claim 1, wherein the fixed output matching network delivers an output signal to an output load with power level in a range of approximately 0.002 watts to 5 watts.

12. The electronic circuit of claim 1 wherein the input matching network is configured to receive an input signal having a first power level and an input frequency in a range of between approximately 1 GHz and 2 GHz, the tunable resonator is tuned to the input frequency, and the electronic circuit generates an output signal from an output of the fixed output matching network having the input frequency and a second power level that is greater than the first power level.

13. A method for signal amplification comprising:
   generating with an input matching network an impedance matched signal corresponding to an input signal, the impedance matched signal being provided to a gate of a transistor to control operation of the transistor;
   generating with the transistor an output through a drain of the transistor that is directly connected to an input of a varactor in response to the impedance matched signal from the input matching network;
   generating with the varactor and an inductor connected to an output of the varactor an amplified output signal corresponding to the input signal; and
   generating with a bias voltage source a bias voltage to adjust a capacitance level of the varactor between a predetermined minimum capacitance and a predetermined maximum capacitance, the capacitance level corresponding to an output frequency of the output signal.

14. A matching circuit comprising:
   a tunable resonator having an input configured to be connected directly to an input signal source, the tunable resonator further comprising:
      a varactor; and
      an inductor connected in series with the varactor; and
   a fixed output matching network comprising at least one inductor-capacitor (LC) circuit with an input that is connected in series to an output of the inductor and an output that is configured to be connected to an output load; wherein
   the varactor further comprises an input directed connected in series to the input signal source; and
   the inductor further comprises an input connected in series to an output of the varactor and an output connected in series to the input of the fixed output matching network.

15. The matching circuit of claim 14, the varactor further comprising:
   at least one pair of varactor elements comprising:
      a first pair of varactor elements connected in series with an anode of one varactor element in the first pair being connected to an input of the varactor, a cathode of the one varactor element in the first pair being connected to a cathode of the other varactor element in the first pair, and an anode of the other varactor element in the first pair being connected to an output of the varactor.

16. The matching circuit of claim 15, the varactor further comprising:
   a second pair of varactor elements connected in series with an anode of one varactor element in the second pair being connected to the input of the varactor, a cathode of the one varactor element in the second pair being connected to a cathode of the other varactor element in the second pair, and an anode of the other varactor element in the second pair being connected to the output of the varactor, the second pair of varactor elements being connected in parallel with the first pair of varactor elements.

17. The matching circuit of claim 16, the fixed output matching network further comprising:
   at least one shunt open-stub connected to the output of the inductor; and
   at least one transmission line connected to the at least one shunt open-stub, the at least one transmission line being configured to be connected to the output load.

18. The method of claim 13, wherein a ratio of the predetermined maximum capacitance and the predetermined minimum capacitance of the varactor is approximately eight to one.

* * * * *